United States Patent [19]

Carvajal et al.

[11] Patent Number: 4,660,065

[45] Date of Patent: Apr. 21, 1987

[54] HALL EFFECT DEVICE WITH SURFACE POTENTIAL SHIELDING LAYER

[75] Inventors: Fernando D. Carvajal, McKinney; Joe R. Trogolo, Plano, both of Tex.

[73] Assignee: Texas Instruments Incorporated, Dallas, Tex.

[21] Appl. No.: 752,496

[22] Filed: Jul. 8, 1985

Related U.S. Application Data

[63] Continuation of Ser. No. 502,905, Jun. 10, 1983.

[51] Int. Cl.$^4$ ............................................ H01L 27/22
[52] U.S. Cl. ........................................ 357/27; 357/47; 357/48; 357/52
[58] Field of Search ............... 357/27, 49, 52 D, 47, 357/50, 48, 4, 6

[56] References Cited

U.S. PATENT DOCUMENTS 3,823,354  7/1974  Janssen ............................. 357/27
3,852,802  12/1974  Wolf et al. ........................ 357/27

Primary Examiner—Andrew J. James
Assistant Examiner—William A. Mintel
Attorney, Agent, or Firm—Richard A. Bachand; N. Rhys Merrett; Melvin Sharp

[57] ABSTRACT

A semiconductor Hall effect device having a stable and more controllable offset voltage is formed, in one embodiment, of an N-type silicon epitaxial layer overlying a P-type silicon substrate, and a P+-type region is formed, for example, by ion implantation, in the surface of the epitaxial layer over the active area of the Hall element. The P+-type region effectively shields the surface of the Hall element to prevent induced surface potential variations. Current and voltage sense contacts are provided by N+-type regions which penetrate through the P+-type shield region to contact the N-type epitaxial layer.

2 Claims, 8 Drawing Figures

HALL EFFECT DEVICE WITH SURFACE POTENTIAL SHIELDING LAYER

This application is a continuation of application Ser. No. 06/502,905, filed June 10, 1983.

BACKGROUND OF THE INVENTION

The present invention relates generally to Hall effect devices and more particularly to an improved Hall effect device that is integratable on a semiconductor chip.

The Hall effect is based on the fact that a charge moving in a magnetic field experiences a Lorentz force proportional to the magnitudes of the applied current and magnetic field. If a metal or semiconductor material carrying a current is placed in an orthogonal magnetic field, an electric field is induced within the material in a direction which is mutually perpendicular to both the current and the magnetic field. The Lorentz force tends to cause the current carriers, i.e., electrons or holes, to accumulate closer to one surface of the material. Since equilibrium must be maintained within the system there is also a charge generated by the accumulated static field which equals the Lorentz force. Therefore a potential difference, the Hall voltage, appears between opposite surfaces of the material.

The use of the Hall effect in semiconductor integrated circuits for linear and switching applications is well known in the art. Practical Hall devices must exhibit high sensitivity, wide operating temperature range, insensitivity to mechanical stress, and durability. Improvements in silicon technology have made it possible to overcome the low mobility and poor sensitivity of silicon by fabricating circuits in which Hall effect generators, preamplifiers, signal conditioning circuits and trigger circuits are integrated on the same semiconductor chip. See, for example, U.S. Pat. No. 4,141,026 to Bate et al., entitled "Hall Effect Generator".

The topology of a typical Hall element structure is shown in FIG. 1, wherein the silicon Hall generator 10 is formed of an N-type epitaxial region 12 surrounded by a P+-type isolation region 14. An insulating layer such as silicon dioxide overlying regions 12 and 14 has openings therein to allow conductors to contact N+-type regions formed in the surface of region 12. The conductors form the current, or force, terminals 16, 18 and the voltage sense terminals 20, 22 of the Hall device. With no magnetic field applied the Hall device 10 can be modeled as a resistor bridge as shown in FIG. 2. In an ideal device R1=R2 and R3=R4, which results in an offset voltage $V_{os} = V_2 - V_1 = 0$.

Variations in the potential on the surface of the silicon dioxide layer will induce variations in the resistance of the underlying silicon. For example, a negative surface potential that is less than the flatband voltage will deplete the N-type silicon surface resulting in a reduction in the thickness of the neutral region in the epitaxial layer, thereby locally increasing the resistance. Conversely, a surface potential greater than the flatband voltage will accumulate the underlying silicon surface resulting in a localized reduction in resistance due to increased conductivity. These resistance changes directly affect the offset voltage.

The offset voltage in prior devices varies unpredictably from device to device and is sensitive to mechanical stress. Further, temperature-induced stress is a problem, particularly with plastic encapsulated devices. Linear Hall effect integrated circuits typically exhibit an output drift equivalent to an input of 4–10 gauss per degree C. These offset voltage instabilities severely limit the usefulness of semiconductor Hall effect devices.

SUMMARY OF THE INVENTION

Accordingly, the present invention overcomes many of the aforementioned disadvantages by providing a semiconductor Hall effect device having a stable, more controllable offset voltage.

In one embodiment of the present invention a Hall device is formed in an N-type epitaxial layer overlying a P-type substrate, and a P+-type region is formed, for example, by ion implantation, in the surface of the epitaxial layer over the active area of the Hall element. The P+-type region effectively shields the surface of the Hall element to prevent induced surface potential variations. Current and voltage sense contacts for the Hall device are provided by N+-type regions which penetrate through the P+-type shield region to contact the N-type epitaxial layer.

It is therefore an object of the present invention to provide a more reliable semiconductor Hall effect device having a stable offset voltage.

Another object is to provide a silicon Hall effect device including a surface potential shielding layer at the surface of the active Hall element.

Still another object is to provide a silicon Hall element formed in an N-type epitaxial layer having a P+-type ion implanted layer to shield the surface of the epitaxial layer from induced surface potential variations.

BRIEF DESCRIPTION OF THE DRAWINGS

Other objects and many of the attendant advantages of the present invention will become apparent, and the invention will be better understood by reference to the following detailed description with the accompanying drawings, wherein.

DETAILED DESCRIPTION OF THE PREFERRED EMBODIMENT

Figure 1:
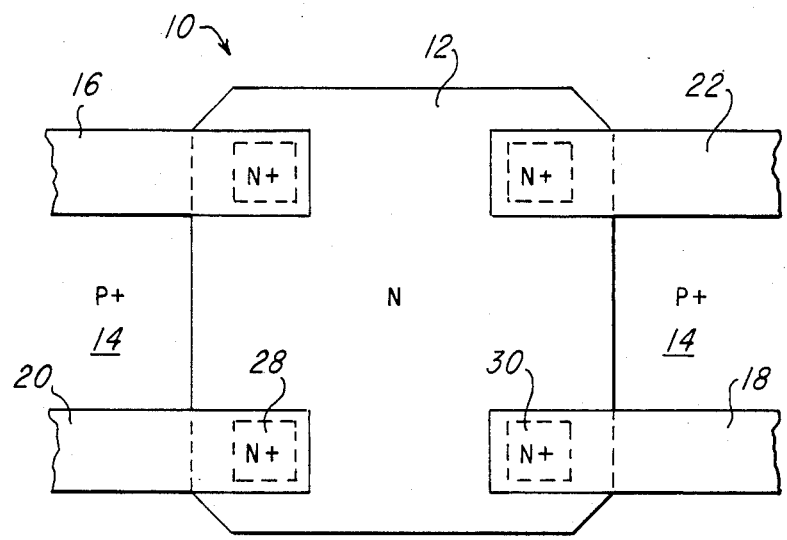
FIG. 1 is a top plan view of a Hall effect device according to the prior art.
Figure 2:
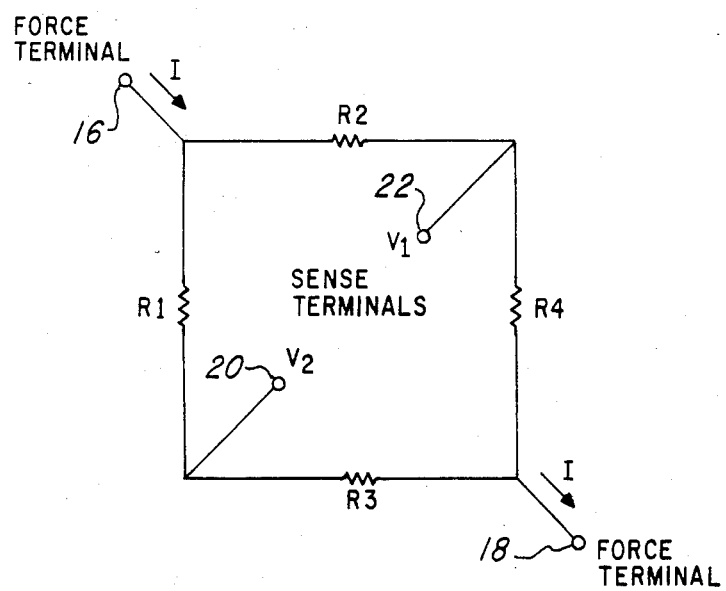
FIG. 2 is a schematic diagram of a resistor model of the device of FIG. 1.
Figure 3:
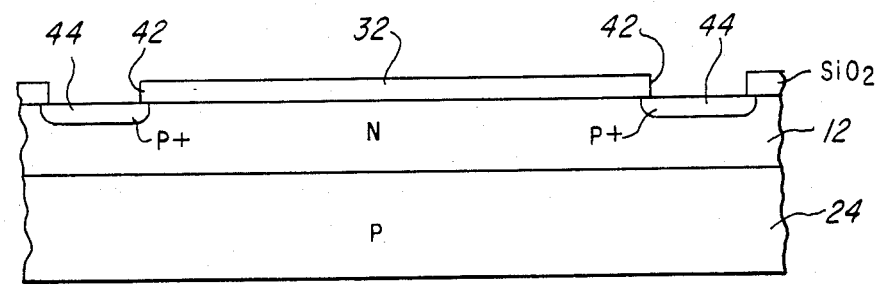
FIGS. 3–7 are cross-sectional views of a Hall effect device according to the present invention showing the device at various stages of fabrication.
Figure 4:
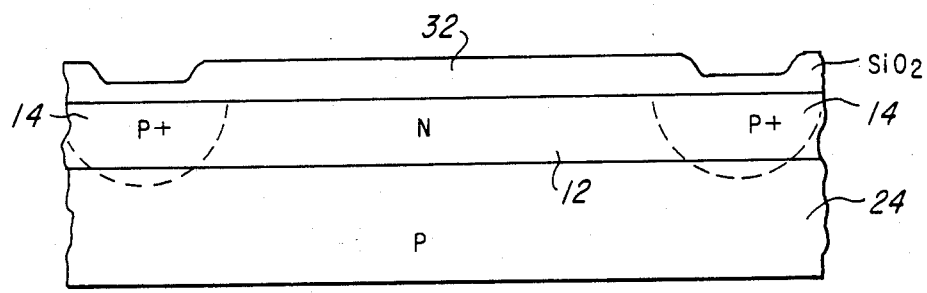
Figure 7:
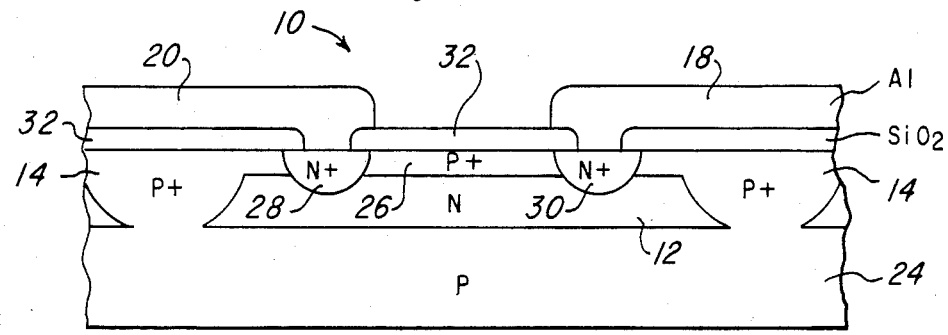

Referring now to the drawings, there is shown in FIG. 1 a top plan view of a typical Hall device as described hereinabove. A Hall device according to the present invention may conveniently be fabricated with the same surface topology. Referring to FIG. 7, there is shown a cross-sectional view in elevation of a completed device according to one embodiment of the invention. For clarity of illustration, similar reference numerals are employed in FIGS. 1 and 7 to denote similar elements of the respective devices.

The silicon Hall effect device 10 is formed in an N-type epitaxial layer 12 overlying a P-type substrate 24. A P+-type region 14 formed by conventional methods extends to the surface of substrate 24 and isolates a portion of layer 12 which will form the active Hall element. A relatively thin P+-type region 26 at the surface of layer 12 overlies the Hall element and preferably overlaps the surrounding isolation region 14. Current and voltage sense contacts for the Hall element are provided by N+-type regions which penetrate through region 26 and contact the underlying epitaxial layer 12. N+-type region 28 is one of the voltage sense contacts and region 30 is another one of the current contacts. An insulating layer 32, for example, silicon dioxide, overlies the Hall element and includes openings therethrough to the N+-type regions 28, 30. A patterned conductive layer, for example, aluminum, overlies layer 32 and contacts regions 28 and 30 to form the terminals for the completed Hall device. Voltage sense terminal 20 and current terminal 18 are shown in FIG. 7.

Figure 8:
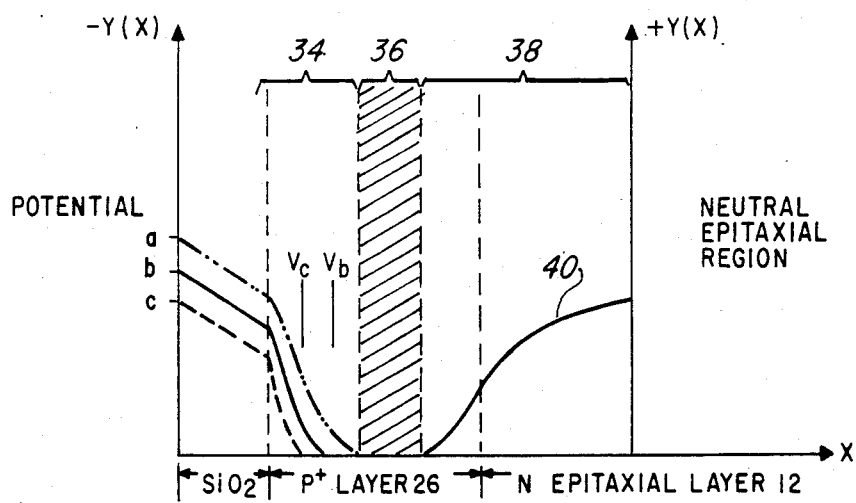
FIG. 8 is a graphical representation of potential as a function of distance from the device surface, illustrating the effect of the shielding layer in reducing induced potential.

The effect of the P+-type shielding region 26 may be better understood by reference to FIG. 8, which is a graphical representation of induced potential in the device as a function of distance from the surface of silicon dioxide layer 32. Curves "a,", "b" and "c" are potential profiles for three surface potentials $V_a$, $V_b$ and $V_c$ on layer 32. Region 34 is the surface depletion region of P+-type layer 26 due to the induced potentials, cross-hatched region 36 is the neutral region of layer 26 which is unaffected by the surface potential, and region 38 is the depletion region of the remaining portion of layer 26 and a portion of the N-type epitaxial layer 12 due to an applied bias voltage. Curve 40 represents a typical potential profile for a Hall effect sensor, which is unaffected by any silicon dioxide layer 32 surface potential. The width of the neutral region 36 of layer 26 will vary depending upon the initial potential at the surface of layer 32. For example, in the case of curve "a" corresponding to potential $V_a$, the width of region 36 is that of the cross-hatched area, i.e., the neutral region 36 beings at the point where $V_a$ is zero or the x-intercept of curve "a". It follows that the width of region 36 increases for lower surface potentials $V_b$ and $V_c$, the width corresponding to the x-intercepts of curves "b" and "c", respectively.

Referring now to FIGS. 3–7, a Hall effect device according to the present invention is fabircated by starting with a P-type silicon substrate 24 having a <111> crystallographic orientation and a resistivity of about 10-20 ohm-cm. An N-type epitaxial layer 12 having a resistivity of about 1-10 ohm-cm. is deposited on substrate 24 to a thickness of approximately 5-50 microns. While an N-type substrate 24 and a P-type epitaxial layer 12 may be used, an N-type epitaxial layer is preferred because of the greater mobility of electrons which results in a greater Hall sensitivity. A silicon dioxide layer 32 is next formed on layer 12, for example, by thermal oxidation, to a thickness of about 7000 Angstroms and patterned by conventional photolithographic methods to form openings 42 therein exposing the surface of layer 12. A P+-type dopant such as boron is then deposited through openings 42 to form regions 44, which are then thermally diffused to form isolation regions 14 extending to the surface of substrate 24 as shown by the dashed lines in FIG. 4. Silicon dioxide is regrown in openings 42 during the diffusion process. Oxide isolation may be used instead of junction isolation to form the active Hall region, however, junction isolation is preferred because of its ease of fabrication.

Figure 5:
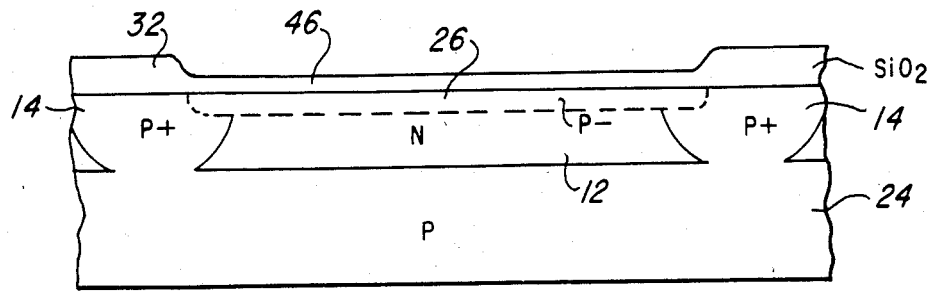
Figure 6:
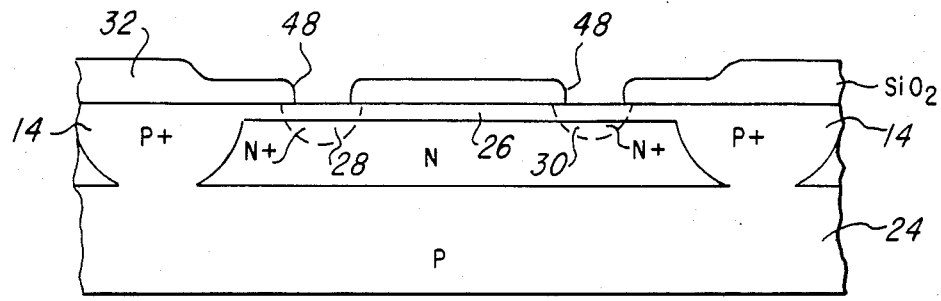

Referring to FIG. 5, an opening is formed in silicon dioxide layer 32 over the surface of epitaxial layer 12 and overlapping a portion of the isolation region 14. The oxide is then regrown to a thickness of about 3000 Angstroms in region 46 of layer 32 to form a mask to reduce damage during the subsequent implantation step. The P+-type shield region 26 is next formed by ion implantation of boron, for example, at about 110 KeV and a dose of about $10^{13}$–$10^{14}$ atoms/cm$^2$. N+-type contact regions 28, 30 are formed as shown in FIG. 6 by forming openings 48 in layer 32 and diffusing phosphorus at a temperature of about 1000°–1100° C. to a junction depth of about 1-5 microns and a sheet resistance in the range of 2-10 ohm/square. The final depth of P+-type region 26 will be about 0.5-2.0 microns. The Hall device is completed by removing any oxide regrown in openings 48 and forming conductors 18, 20, e.g., by aluminum evaporation, patterning and sintering.

It is important that the dopant concentration of layer 26 be light enough so that the N+-type regions 28, 30 can penetrate layer 26 to contact epitaxial layer 12. Also, the N-to-P avalanche breakdown voltage must be greater than that required by the associated circuits formed on the same chip. Finally, the surface concentration of layer 26 must be such that the MOS inversion threshold voltage is greater than the Hall operating voltage to prevent inversion of the P+-type layer, and the dopant concentration must be heavy enough to provide an effective shield against variations in the layer 32 surface potential as described above.

It will be apparent that the foregoing process permits associated devices and circuits to readily be formed concurrent with the fabrication of the Hall element to provide a completely integrated linear Hall sensor or Hall switching circuit.

Other embodiments and modifications of the present invention will readily come to those skilled in the art having the benefit of the foregoing description and drawings. It is therefore to be understood that such modifications and embodiments are intended to fall within the spirit and scope of the appended claims.

What is claimed is:

1. An integrated Hall effect device comprising:
   a semiconductor substrate of one conductivity type;
   a semiconductor layer of an opposite conductivity type overlying said substrate;
   an isolating region of said one conductivity type formed in said semiconductor layer and extending from the surface thereof to at least the surface of said substrate to contact said substrate, said isolating region surrounding a portion of said semiconductor layer to encompass and isolate an island thereof;
   a second region of said one conductivity type formed in said island extending a predetermined depth beneath and entirely across the surface of said island, extending at least to contact said isolating region to create an isolated surface over said island, said second region being of depth of between about 0.5 and 2.0 microns, wherein said island contains a Hall effect current path entirely therewithin away from said surface and above said substrate; and
   a plurality of spaced apart third regions of said opposite conductivity type formed in said second region extending below the lower surface of said second region to contact preselected portions of said first region of said semiconductor layer, to form current and voltage sense contacts to said Hall effect device.

2. The Hall effect device of claim 1 wherein said substrate is P-type, said semiconductor layer is N-type, said isolation region and said second region are P+-type, and said third regions are N+-type conductivities.

* * * * *